United States Patent
Kuramachi

(10) Patent No.: US 7,202,558 B2
(45) Date of Patent: Apr. 10, 2007

(54) PACKAGES BASE WHICH ALLOWS MOUNTING OF A SEMICONDUCTOR ELEMENT AND ELECTRODE-WIRING TERMINALS ON A MOUNTING SURFACE

(75) Inventor: Teruhiko Kuramachi, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 438 days.

(21) Appl. No.: 10/131,465

(22) Filed: Apr. 25, 2002

(65) Prior Publication Data

US 2002/0179920 A1    Dec. 5, 2002

(30) Foreign Application Priority Data

Apr. 26, 2001   (JP) ............................. 2001-128640

(51) Int. Cl.
H01L 23/14 (2006.01)
H01L 23/04 (2006.01)
H01L 29/40 (2006.01)

(52) U.S. Cl. .................. 257/702; 257/713; 257/724; 257/712; 257/784

(58) Field of Classification Search ............... 257/723, 257/724, 88, 712, 713, E23.03, E23.11, 702, 257/784; 385/92, 53, 54, 36, 50; 372/36, 372/50
See application file for complete search history.

(56) References Cited

U.S. PATENT DOCUMENTS

| | | | | |
|---|---|---|---|---|
| 5,412,748 A | * | 5/1995 | Furuyama et al. | 385/92 |
| 5,703,399 A | * | 12/1997 | Majumdar et al. | 257/723 |
| 5,801,438 A | * | 9/1998 | Shirakawa et al. | 257/685 |
| 6,001,224 A | * | 12/1999 | Drummond et al. | 204/192.12 |
| 6,058,012 A | * | 5/2000 | Cooper et al. | 361/704 |
| 6,155,724 A | * | 12/2000 | Ichino et al. | 385/92 |
| 6,278,179 B1 | * | 8/2001 | Mermet-Guyennet | 257/686 |
| 6,414,388 B1 | * | 7/2002 | Moriyama | 257/724 |
| 6,432,750 B2 | * | 8/2002 | Jeon et al. | 438/122 |
| 6,445,591 B1 | * | 9/2002 | Kwong | 361/761 |
| 6,476,625 B1 | * | 11/2002 | Do | 324/755 |
| 6,489,686 B2 | * | 12/2002 | Farooq et al. | 257/777 |
| 6,501,172 B1 | * | 12/2002 | Fukada et al. | 257/707 |

FOREIGN PATENT DOCUMENTS

| | | |
|---|---|---|
| JP | 8-111481 | 4/1996 |
| JP | 10-107190 | 4/1998 |

* cited by examiner

Primary Examiner—Douglas W. Owens
Assistant Examiner—Samuel A Gebremariam
(74) Attorney, Agent, or Firm—Sughrue Mion, PLLC

(57) ABSTRACT

A package base for a semiconductor element is made of a carbon composite material. The mounting surface of the package base includes a first area on which at least one first element including at least one semiconductor element is to be mounted, and a second area on which at least one second element including at least a terminal for electrode wiring is to be mounted. Preferably, the carbon composite material is a high-density, isotropic carbon-fiber composite material. In addition, the mounting surface may have a step change in surface elevation for alignment of either of the at least one first element and the at least one second element.

19 Claims, 3 Drawing Sheets

PACKAGES BASE WHICH ALLOWS MOUNTING OF A SEMICONDUCTOR ELEMENT AND ELECTRODE-WIRING TERMINALS ON A MOUNTING SURFACE

BACKGROUND OF THE INVENTION

1. Field of the Invention

The present invention relates to a package base on which a semiconductor element and one or more other elements such as optical elements can be mounted. The present invention also relates to a semiconductor package in which a semiconductor element and one or more other elements such as optical elements are mounted on a package base. For example, the semiconductor element is an LED (light emitting diode), an LD (laser diode), or a PD (photo diode), and the optical elements are an optical fiber, an optical crystal, a lens, and the like.

2. Description of the Related Art

Package bases (including heatsinks, stems, carriers, and the like) for semiconductor light-emitting elements, semiconductor light-receiving elements, and the like are required to satisfy the following conditions:

(i) The package bases have high heat conductivity and temperature controllability.
(ii) Portions of the package bases in contact with the semiconductor elements have thermal expansion coefficients close to the thermal expansion coefficients of the semiconductor materials so that the package bases do not impose great thermal stress on the semiconductor elements.
(iii) The material cost is sufficiently low.
(iv) Assembly is easy, and high positioning precision can be achieved.
(v) Electrodes wiring for driving the light-emitting elements and the light-receiving elements is possible.
(vi) Bonding does not cause deterioration of characteristics of the semiconductor light-emitting elements, semiconductor light-receiving elements, and the like.

The Japanese Unexamined Patent Publications Nos. 8 (1996)-111481 and 10(1998)-107190 disclose use, as a heatsink, of a member being made of a carbon-fiber composite material and having a tabular form, where the member used as the heatsink is formed so as to have a flat mounting surface for a semiconductor element. The carbon-fiber composite material has high heat conductivity, and enables easy temperature control. In addition, since the carbon-fiber composite material has a thermal expansion coefficient close to the thermal expansion coefficients of the semiconductors, the thermal stress imposed on the semiconductor elements can be suppressed.

However, the methods disclosed in the above patent publications require at least two bonding processes. That is, a semiconductor element (e.g., a semiconductor light-emitting element, semiconductor light-receiving element, or the like) is bonded to a heatsink in the first process, and the heatsink is bonded to another member on which electrode connection portions (electrode terminals) and the like are formed, in the second process. Therefore, the mounting precision deteriorates and the manufacturing cost increases.

In addition, the Japanese Unexamined Patent Publication No. 10(1998)-107190 discloses a semiconductor package having a layered structure comprised of a semiconductor element, a buffering member (heatsink), and a metal radiation plate, which is characterized in that the buffering member is a plate made of a carbon-fiber composite material. However, when a plurality of elements, e.g., a semiconductor element and an optical waveguide, are mounted, alignment of the semiconductor element and the optical waveguide is difficult since the mounting surface of the buffering member (heatsink) is uniformly flat. Further, since terminals for electrodes and the like are not provided on the buffering member (heatsink), it is not easy to operate the semiconductor element on the buffering member (heatsink).

The Japanese Unexamined Patent Publication No. 8 (1996)-111481 discloses a heatsink for a semiconductor element, which is characterized in that the heatsink has a thermal expansion coefficient which is substantially identical to that of the semiconductor element mounted on the heatsink, and is made of a unidirectional carbon/carbon-fiber composite material which is heat conductive in the thickness direction. However, since the physical properties (including hardness) of the carbon fiber portions of the unidirectional carbon/carbon-fiber composite material are different from those in the other portions of the unidirectional carbon/carbon-fiber composite material, it is difficult to make the mounting surface a mirror-finished surface. In addition, although the heat conductivity in the thickness direction is high, the heat conductivity in the other directions is low. Therefore, the degree of freedom in designing the shapes of the packages and the like is small. Further, as in the case of JUPP 10(1998)-107190, when a plurality of elements, e.g., a semiconductor element and an optical waveguide, are mounted, alignment of the semiconductor element and the optical waveguide is difficult since the mounting surface of the buffering member (heatsink) is uniformly flat. Furthermore, since terminals for electrodes and the like are not provided on the buffering member (heatsink), it is not easy to operate the semiconductor element on the buffering member (heatsink).

SUMMARY OF THE INVENTION

An object of the present invention is to provide a package base on which at least a semiconductor element can be mounted, and which improves the mounting precision, reduces the manufacturing cost, and increases the degree of freedom in module design.

Another object of the present invention is to provide a semiconductor package in which a semiconductor element and one or more other elements such as optical elements are mounted on a package base with high mounting precision, and which can be designed with a great degree of freedom and produced at low manufacturing cost.

According to the first aspect of the present invention, there is provided a package base being made of a carbon composite material and having a mounting surface. The mounting surface includes a first area on which at least one first element including at least one semiconductor element is to be mounted, and a second area on which at least one second element including at least a terminal for electrode wiring is to be mounted.

The at least one second element may include an optical element such as a lens or an optical fiber, as well as the terminal for electrode wiring.

When the package base according to the first aspect of the present invention is used, both the at least one first element including at least one semiconductor element and the at least one second element including at least a terminal for electrode wiring can be mounted on the same mounting surface. Therefore, the aforementioned two bonding processes required in the conventional techniques can be reduced to a single bonding process. Thus, the mounting precision can be improved, and the manufacturing cost can be reduced, Further, the package base according to the first aspect of the present invention may also have one or any possible combination of the following additional features (i) to (vii).

(i) The carbon composite material may be an isotropic carbon-fiber composite material.

When the carbon composite material is an isotropic carbon-fiber composite material, the thermal expansion coefficient of the package base is close to the thermal expansion coefficients of the semiconductor materials. Therefore, the strain caused by the mounting of the semiconductor element on the package base can be reduced. In this case, restrictions on the thickness and the soldering material can be eased, and the degree of freedom in shape design can be increased.

(ii) The carbon composite material may be a high-density, isotropic carbon-fiber composite material.

In this case, a mirror-finished surface can be easily formed. In addition, since the direction dependence of the heat conductivity disappears, the degree of freedom in design of the package and the like can be increased.

(iii) The carbon composite material may have a heat conductivity coefficient of 200 W/m·K or greater, and a thermal expansion coefficient of $4 \times 10^{-6}$ to $10 \times 10^{-6}$/° C. in the first area in directions parallel to the mounting surface.

When the carbon composite material satisfies the above conditions, the thermal expansion coefficient of the package base becomes equivalent to the thermal expansion coefficients of the semiconductor materials. Therefore, the strain caused by the mounting of the semiconductor element on the package base can be particularly reduced. Thus, restrictions on the thickness and the soldering material can be eased, and the degree of freedom in shape design can be increased.

(iv) The mounting surface may have a step change in surface elevation for alignment of either of the at least one first element and the at least one second element.

In this case, the at least one first element or the at least one second element (i.e., at least one semiconductor element or the terminal for electrode wiring) can be easily mounted on the package base in a well aligned manner.

(v) The mounting surface may have a step change in surface elevation between the first and second areas so that the first area is located above the second area.

If the above step change is not formed on the package base, solder used for bonding an insulator to the package base can spread, pollute the area in which the at least one first element (including the at least one semiconductor element) is bonded to the package base, and cause defective packaging of the semiconductor element, where the terminal for electrode wiring is formed on the insulator. However, when the package base according to the first aspect of the present invention has the feature (v), the step change formed on the package base prevents the spread of the solder, the pollution of the area in which the at least one first element is bonded to the package base, and the defective packaging of the semiconductor element.

(vi) In the package base having the feature (v), the step change may be 0.1 mm or greater.

In this case, the effects of the feature (v) are further enhanced.

(vii) The mounting surface may have a step change in surface elevation between the first and second areas so that the terminal is located above the upper surface of the at least one semiconductor element when the terminal and the at least one semiconductor element are mounted on the package base.

In this case, it is possible to prevent occurrence of a defect such as disconnection in wire bonding.

According to the second aspect of the present invention, there is provided a semiconductor package comprising: at least one first element including at least one semiconductor element; at least one second element including at least a terminal for electrode wiring; and a package base being made of a carbon composite material and having a mounting surface. The mounting surface includes a first area on which the at least one first element is mounted, and a second area on which the at least one second element is mounted.

That is, the package base according to the first aspect of the present invention is used in the semiconductor package according to the second aspect of the present invention. Therefore, the semiconductor package according to the second aspect of the present invention can be produced in a small number of manufacturing steps. Thus, the manufacturing cost can be reduced, Further, the semiconductor package according to the second aspect of the present invention may also have one or any possible combination of the following additional features (viii) to (xvi).

(viii) The carbon composite material may be an isotropic carbon-fiber composite material.

(ix) The carbon composite material may have a heat conductivity coefficient of 200 W/m·K or greater, and a thermal expansion coefficient of $4 \times 10^{-6}$ to $10 \times 10^{-6}$/° C. in the first area in directions parallel to the mounting surface.

(x) The mounting surface may have a step change in surface elevation for alignment of either of the at least one first element and the at least one second element.

(xi) The mounting surface may have a step change in surface elevation between the first and second areas so that the first area is located above the second area, and the terminal comprises an insulator being mounted on the second area and having a thickness greater than the step change, and a conductive film formed on the insulator.

(xii) In the semiconductor package having the feature (xi), the step change may be 0.1 mm or greater.

(xiii) In the semiconductor package having the feature (xi), the insulator may be made of $Al_2O_3$, the conductive film may be comprised of at least one layer, and an uppermost one of the at least one layer may be made of gold.

(xiv) In the semiconductor package having the feature (xi), the insulator may be bonded onto the second area with Au—Ge-based or Au—Sn-based solder.

(xv) In the semiconductor package according to the second aspect of the present invention, the mounting surface may have a step change in surface elevation between the first and second areas so that the terminal is located above the upper surface of the at least one semiconductor element (xvi) In the semiconductor package having the feature (xv), the terminal may comprise an insulation film being formed on the second area, and a conductive film formed on the insulation film.

DESCRIPTION OF PREFERRED EMBODIMENTS

Embodiments of the present invention are explained in detail below with reference to drawings.

First Embodiment

Figure 1:
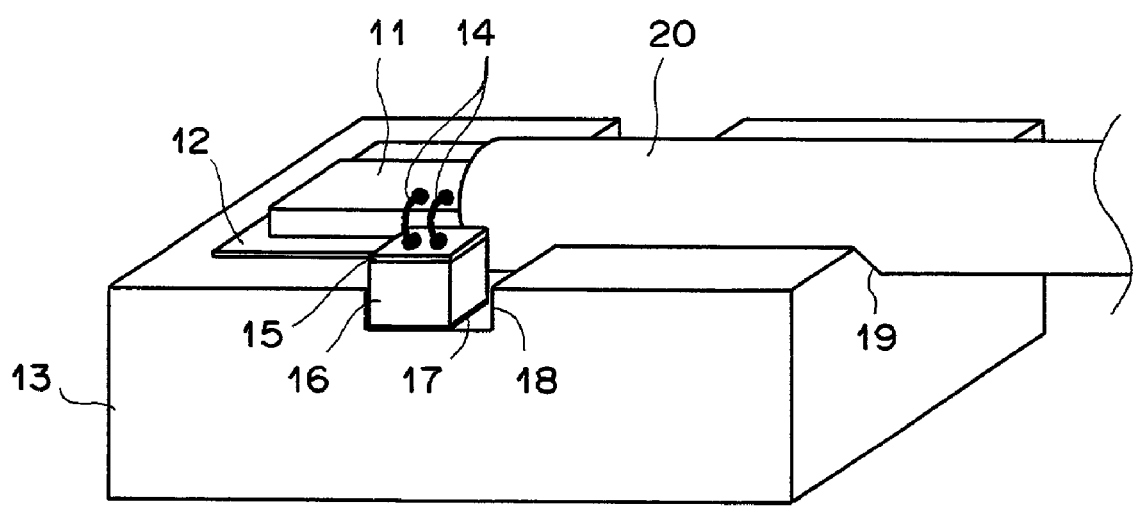
FIG. 1 is a perspective view of a semiconductor package in which a semiconductor light-emitting element and other elements are mounted on a package base as a first embodiment of the present invention.

FIG. 1 is a perspective view of a semiconductor package in which a semiconductor light-emitting element and other elements are mounted on a package base as the first embodiment of the present invention.

The package base 13 as the first embodiment of the present invention is made from a plate of a Au/Ni plated, high-density, isotropic carbon-fiber composite material having a thickness of 3 mm. In addition, first and second step changes 18 and 19 in surface elevation are formed on the upper surface of the package base 13. The first step change 18 is arranged between a first area on which a semiconductor element is to be mounted and a second area on which terminals for electrode wiring are to be formed, for preventing upward creepage of solder and positioning the semiconductor light-emitting element, where the first area is located at a higher elevation than the second area. In addition, the second step change 19 is realized by a groove arranged for positioning the semiconductor light-emitting element and an optical fiber. After the first and second step changes 18 and 19 are formed as above, the plate is sliced into a rectangular form with dimensions of 10 mm×20 mm by using a wire saw or a blade saw.

In the semiconductor package of FIG. 1, a ceramic member 16 as an insulator is bonded onto the second area of the package base 13 through Au—Ge-based solder 17, and an electrode (metal) layer 15 is arranged on the ceramic member 16 so as to realize the terminals for electrode wiring. In addition, the semiconductor light-emitting element 11 is mounted on the first area of the package base 13 through a Au—Sn-based solder layer 12, and electrodes of the semiconductor light-emitting element 11 are connected to the terminals for electrode wiring through Au wires 14. Further, an optical fiber 20 is mounted along the second step change 19 on the package base 13.

Specifically, the mounting of the semiconductor light-emitting element 11, the terminals for electrode wiring, and the optical fiber 20 on the package base 13 is realized by the following processes.

The ceramic member 16, which is made of $Al_2O_3$, is bonded onto the second area of the package base 13 with the Au—Ge-based solder 17 by heating at the temperature of 500° C. or lower. In addition, a composite metal layer comprised of multiple sublayers of nickel, platinum, gold, and the like is formed by plating, evaporation, and the like. The composite metal layer realizes the electrode layer 15, i.e., the terminals for electrode wiring. The ceramic member 16 has such a thickness that the elevation of the terminals for electrode wiring is higher than the elevation of the upper surface of the semiconductor light-emitting element 11. Thereafter, the Au—Sn-based solder layer 12 is formed on the first area of the package base 13 by sputtering, evaporation, or the like, and the semiconductor light-emitting element 11 is bonded onto the Au—Sn-based solder layer 12 by heating adhesion in alignment with a guide edge realized by the first step change 18. Then, the opposite ends of the Au wires 14 are bonded to the electrodes of the semiconductor light-emitting element 11 and the terminals realized by the electrode layer 15, respectively. Finally, the optical fiber 20 is aligned with the second step change 19, and bonded to the package base 13 by using an ultraviolet curable resin.

Second Embodiment

Figure 2:
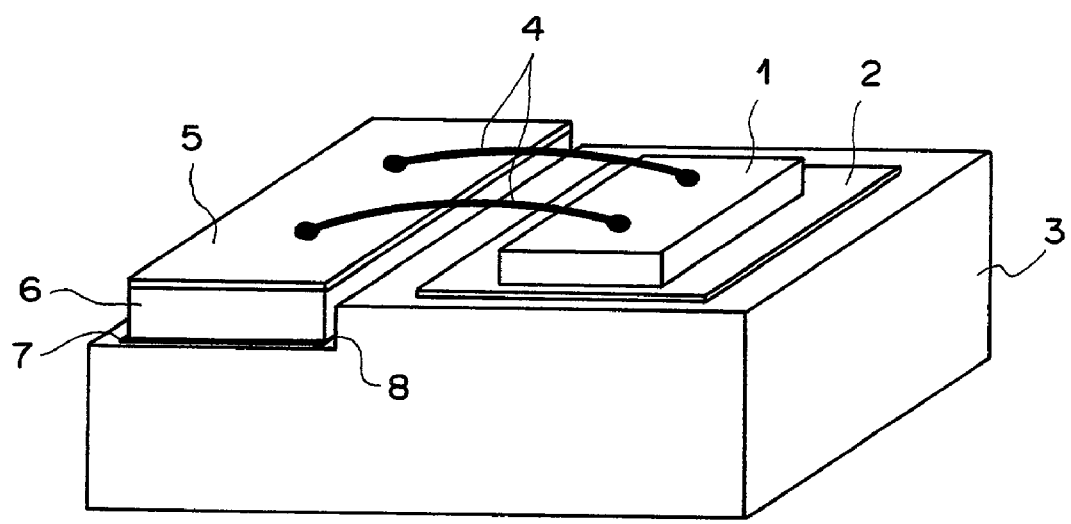
FIG. 2 is a perspective view of a semiconductor package in which a semiconductor light-emitting element and other elements are mounted on a package base as a second embodiment of the present invention.

FIG. 2 is a perspective view of a semiconductor package in which a semiconductor light-emitting element and other elements are mounted on a package base as the second embodiment of the present invention.

The package base 3 as the second embodiment of the present invention is made from a plate of a Au/Ni plated, high-density, isotropic carbon-fiber composite material having a thickness of 3 mm. In addition, a step change 8 of 0.1 mm in surface elevation is formed on the upper surface of the package base 3. The step change 8 is arranged between a first area of the mounting surface of the package base 3 on which semiconductor elements are to be mounted and a second area of the mounting surface of the package base 3 on which terminals for electrode wiring are to be formed, and the first area is located at a higher elevation than the second area. After the step change 8 is formed as above, the plate is sliced into a rectangular form with dimensions of 2 mm×4 mm by using a wire saw or a blade saw.

In the semiconductor package of FIG. 2, a ceramic member 6 as an insulator is bonded onto the second area of the package base 3 through Au—Ge-based solder 7, and an electrode (metal) layer 5 is arranged on the ceramic member 6 so as to realize terminals for electrode wiring. In addition, the semiconductor light-emitting element 1 is mounted on the first area of the package base 3 through a Au—Sn-based solder layer 2, and electrodes of the semiconductor light-emitting element 1 are connected to the terminals for electrode wiring through Au wires 4.

Specifically, the mounting of the semiconductor light-emitting element 1 and the terminals for electrode wiring on the package base 3 is realized by the following processes.

The ceramic member 6, which is made of $Al_2O_3$, is bonded onto the second area of the package base 3 with the Au—Ge-based solder 7 by heating at the temperature of 500° C. or lower. In addition, a composite metal layer comprised of multiple sublayers of nickel, platinum, gold, and the like is formed by plating, evaporation, and the like. The composite metal layer realizes the electrode (metal) layer 5, i.e., the terminals for electrode wiring. The ceramic member 6 has such a thickness that the elevation of the terminals for electrode wiring is higher than the elevation of the upper surface of the semiconductor light-emitting element 1. Thereafter, the Au—Sn-based solder layer 2 is formed on the first area of the package base 3 by sputtering, evaporation, or the like, and the semiconductor light-emitting element 1 is bonded onto the Au—Sn-based solder layer 2 by heating adhesion. Then, the opposite ends of the Au wires 4 are bonded to the electrodes of the semiconductor light-emitting element 1 and the terminals realized by the metal layer 5, respectively.

If the step change 8 is not formed on the package base 3, the Au—Ge-based solder 7, which is used for bonding the ceramic member 6 to the package base 3, can spread, pollute the area in which the semiconductor element 1 is bonded to the package base 3, and cause defective packaging of the semiconductor element. However, in the semiconductor package of FIG. 2, the step change 8 formed on the package base 3 prevents the spread of the Au—Ge-based solder 7, the pollution of the area in which the semiconductor element is bonded to the package base 3, and the defective packaging of the semiconductor element.

Third Embodiment

Figure 3:
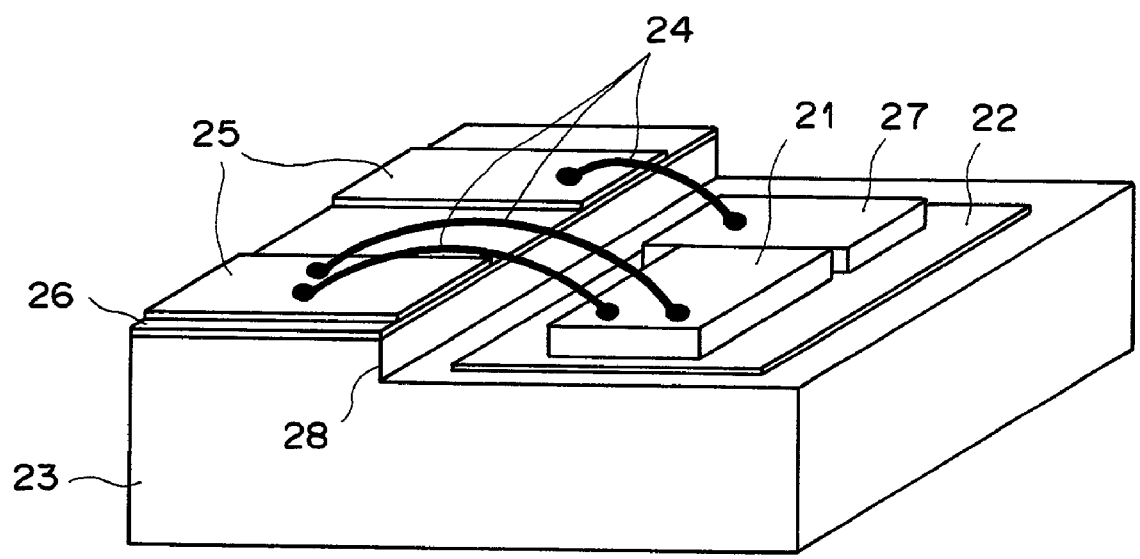
FIG. 3 is a perspective view of a semiconductor package in which a semiconductor light-emitting element and other elements are mounted on a package base as a third embodiment of the present invention.

FIG. 3 is a perspective view of a semiconductor package in which a semiconductor light-emitting element and other elements are mounted on a package base as the third embodiment of the present invention.

The package base 23 as the third embodiment of the present invention is made from a plate of a Au/Ni plated, high-density, isotropic carbon-fiber composite material having a thickness of 3 mm. In addition, a step change 28 in surface elevation is formed on the upper surface of the package base 23. The step change 28 is arranged between a first area of the mounting surface of the package base 3 on which semiconductor elements are to be mounted and a second area of the mounting surface of the package base 3 on which terminals for electrode wiring are to be formed, where the first area is located at a lower elevation than the second area, and the difference between the elevations of the first and second areas is equal to or greater than the thickness of a semiconductor light-emitting element 21. After the step change 28 is formed as above, the plate is sliced into a rectangular form with predetermined dimensions, e.g., 10 mm×5 mm, by using a wire saw or the like.

In the semiconductor package of FIG. 3, an insulation layer 26 is formed on the second area of the package base 23, and a metal layer 25 is arranged on the insulation layer 26 so as to realize the terminals for electrode wiring. That is, the metal layer 25 has a shape of an electrode pattern which realizes the terminals for electrode wiring. In addition, the semiconductor light-emitting element 21 and a semiconductor optical waveguide element 27 are mounted on the first area of the package base 23 through a Au—Sn-based solder layer 22, and electrodes of the semiconductor light-emitting element 21 and the semiconductor optical waveguide element 27 are connected to the terminals for electrode wiring through Au wires 24.

In the third embodiment, the semiconductor package is produced in the following steps:
  (i) The plate of the high-density isotropic carbon fiber material having a thickness of 3 mm is produced.
  (ii) The step change 28 is formed on the upper surface of the plate.
  (iii) The terminals for electrode wiring is formed on a portion of the upper surface of the plate corresponding to the first area. Specifically, the insulation layer 26, which is made of $Al_2O_3$ and has a thickness of 3,000 Angstrom or greater, is formed on the second area of the package base 23 by using a sputtering system or the like. Then, an electrode pattern is formed on the $Al_2O_3$ insulation layer 26 by using a resist, and a composite metal layer comprised of multiple sublayers of nickel, platinum, gold, and the like is formed by plating, evaporation, and the like. The composite metal layer realizes the metal layer 25, i.e., the terminals for electrode wiring.
  (iv) The Au—Sn-based solder layer 22 is formed on another portion of the upper surface of the plate corresponding to the second area by sputtering, evaporation, or the like.
  (v) The plate is sliced into package bases 23 each having the predetermined dimensions.
  (vi) The semiconductor light-emitting element 21 and the semiconductor optical waveguide element 27 are bonded onto the Au—Sn-based solder layer 22 on each package base 23 by heat adhesion.
  (vii) The electrodes of the semiconductor light-emitting element 21 and the semiconductor optical waveguide element 27 are connected to the respectively corresponding terminals in the metal layer 25 with the Au wires.

Since the step change 28 formed on the upper surface of the package base 23 is greater than the thickness of the semiconductor light-emitting element 21, it is possible to arrange the terminals for electrode wiring at a higher elevation than the elevation of the upper surface of the semiconductor light-emitting element 21 without the thick ceramic member which is provided in the first and second embodiments. Therefore, the wire bonding with the Au wires can be easily performed so as not cause a defect such as disconnection.

Carbon-fiber Composite Material

The Au/Ni plated, high-density, isotropic carbon-fiber composite material used in the first to third embodiments is, for example, an aluminum-impregnated carbon composite material plated with Au and Ni, where the aluminum-impregnated carbon composite material is produced by impregnating a carbon-fiber preform with aluminum and solidifying the aluminum-impregnated carbon-fiber preform. Although the carbon-fiber composite material may be either isotropic or unidirectional, isotropic carbon-fiber composite materials are preferable since the degree of freedom in module design is increased by use of the isotropic carbon-fiber composite materials.

Table 1 shows concrete examples of the above carbon-fiber composite materials. The materials indicated in Table 1 are available from Advanced Materials International Company (Kabushiki Kaisha Sentan Zairyo), in Japan.

It is preferable that the carbon-fiber composite materials used for producing the package bases as the first to third embodiments of the present invention have heat conductivity of 200 W/m·K or greater in the thickness direction and linear expansion coefficients of $4 \times 10^{-6}$ to $10 \times 10^{-6}/°$ C. at the base surface (element mounting surface), as illustrated in Table 1.

TABLE 1

Examples of Carbon-fiber Composite Materials

| Trade Name | Heat Conductivity W/m · K | Linear Expansion Coefficient × $10^{-6}/°$ C. | Disruptive Strength MPa |
|---|---|---|---|
| SZ500 | 500 | 10 | 20 |
| SZ300 | 300 | 5 | 30 |
| SZ200 | 200 | 8 | 100 |

What is claimed is:

1. A package base being made of a carbon composite material and having a mounting surface which includes:
   a first area on which at least one first element including at least one semiconductor element is to be mounted; and a second area on which at least one second element including at least a terminal for electrode wiring is to be mounted, wherein said package base having the mounting surface has a unitary, monolithic, one-piece construction, wherein said mounting surface of said package base has a step change in surface elevation between said first area and said second area, wherein the first area includes an Au—Sn-based solder and the second area includes an Au—Ge-based solder, and wherein the one semiconductor element is mounted on the first area through the Au—Sn-based solder and an insulator is bonded on the second area through the Au—Ge-based solder.

2. A package base according to claim 1, wherein said carbon composite material is an isotropic carbon-fiber composite material.

3. A package base according to claim 1, wherein said carbon composite material has a heat conductivity coefficient of 200 W/m·K or greater, and a thermal expansion coefficient of $4 \times 10^{-6}$ to $10 \times 10^{-6}/°$ C. in said first area in directions parallel to said mounting surface.

4. A package base according to claim 1, wherein said step change in surface elevation is operative to align either of said at least one first element or said at least one second element.

5. A package base according to claim 1, wherein said step change in surface elevation is characterized by said first area being located above said second area.

6. A package base according to claim 5, wherein said step change is 0.1 mm or greater.

7. A package base according to claim 1, wherein said step change in surface elevation is arranged so that said terminal is located above an upper surface of said at least one semiconductor element when said terminal and said at least one semiconductor element are mounted on said package base.

8. A package base according to claim 1, said mounting surface of said package base further including a second step change operative to align with said first area, an optical element to be mounted.

9. A package base according to claim 8, wherein said second step change is realized as a groove, shaped to receive at least an optical fiber as the optical element.

10. A semiconductor package comprising:
at least one first element including at least one semiconductor element;
at least one second element including at least a terminal for electrode wiring; and
a package base being made of a carbon composite material, having a unitary, monolithic, one-piece construction, and having a mounting surface which includes,
a first area on which said at least one first element is mounted, and
a second area on which said at least one second element is mounted,
wherein said mounting surface of said package base has a step change in surface elevation between said first area and said second area,
wherein said step change in surface elevation is arranged so that said first area is located above said second area, and
said terminal comprises,
an insulator being mounted on said second area and having a thickness greater than said step change, and
a conductive film formed on said insulator.

11. A semiconductor package according to claim 10, wherein said carbon composite material is an isotropic carbon-fiber composite material.

12. A semiconductor package according to claim 10, wherein said carbon composite material has a heat conductivity coefficient of 200 W/m·K or greater, and a thermal expansion coefficient of $4 \times 10^{-6}$ to $10 \times 10^{-6}/°$ C. in said first area in directions parallel to said mounting surface.

13. A semiconductor package according to claim 10, wherein said step change in surface elevation aligns either of said at least one first element or said at least one second element.

14. A semiconductor package according to claim 10, wherein said step change is 0.1 mm or greater.

15. A semiconductor package according to claim 10, wherein said insulator is made of $Al_2O_3$, said conductive film is comprised of at least one layer, and an uppermost one of the at least one layer is made of gold.

16. A semiconductor package according to claim 10, wherein said insulator is bonded onto said second area with Au—Ge-based or Au-Sn-based solder.

17. A semiconductor package according to claim 10, wherein said at least one semiconductor element comprises a semiconductor light-emitting element, and said mounting surface of said package base further includes a second step change operative to align an optical element with said semiconductor light-emitting element.

18. A semiconductor package according to claim 17, wherein said second step change is realized as a groove, shaped to receive at least an optical fiber as the optical element, wherein said groove is arranged to align an end face of the optical fiber with a lateral surface of the semiconductor light-emitting element, the lateral surface being lateral relative to a surface of said semiconductor light emitting element by which said semiconductor light emitting element is mounted to said first area, wherein said groove extends away from said lateral surface.

19. A semiconductor package comprising:
at least one first element including at least one semiconductor element;
at least one second element including at least a terminal for electrode wiring; and
a package base being made of a carbon composite material, having a unitary, monolithic, one-piece construction, and having a mounting surface which includes,
a first area on which said at least one first element is mounted, and
a second area on which said at least one second element is mounted,
wherein said mounting surface of said package base has a step change in surface elevation between said first area and said second area,
and said step change in surface elevation is arranged so that said terminal is located above an upper surface of said at least one semiconductor element, and said terminal comprises an insulation film being formed on said second area and a conductive film formed on said insulation film.

* * * * *